United States Patent [19]

Akabane et al.

[11] 4,210,924
[45] Jul. 1, 1980

[54] SEMICONDUCTOR CONTROLLED RECTIFIER WITH CONFIGURED CATHODE TO ELIMINATE HOT-SPOTS

[75] Inventors: Katsumi Akabane; Isao Kojima; Yoshikazu Takita; Soushi Suzuki; Yasuhiko Ikeda; Koichi Wajima, all of Hitachi; Yoshio Terasawa, Katsuta, all of Japan

[73] Assignee: Hitachi, Ltd., Japan

[21] Appl. No.: 941,588

[22] Filed: Sep. 12, 1978

[30] Foreign Application Priority Data

Sep. 14, 1977 [JP] Japan .................................. 52-109922

[51] Int. Cl.² ........................................... H01L 29/74
[52] U.S. Cl. ...................................... 357/38; 357/20; 357/86
[58] Field of Search ........................... 357/38, 86, 20

[56] References Cited

U.S. PATENT DOCUMENTS

| | | | |
|---|---|---|---|
| 3,590,346 | 6/1971 | Bilo et al. | 357/38 |
| 3,777,229 | 12/1973 | Burtscher et al. | 357/38 |
| 3,990,090 | 11/1976 | Terasawa et al. | 357/38 |
| 4,063,270 | 12/1977 | Kimura et al. | 357/38 |
| 4,114,178 | 12/1978 | Terasawa et al. | 357/38 |

*Primary Examiner*—Joseph E. Clawson, Jr.
*Attorney, Agent, or Firm*—Craig & Antonelli

[57] ABSTRACT

A semiconductor controlled rectifier comprises a semiconductor substrate having four layers of alternate n- and p-type conductivities and includes two main surfaces one of which is formed of the exposed surface of first and second layers and the other of which is formed of the exposed surface of a fourth layer. A gate electrode of a rectangular shape is disposed on the second layer on the one main surface and a cathode electrode is disposed on the first layer so as to extend along at least two sides of the rectangular gate electrode. The cathode electrode portion extending along the short side of the rectangular gate extends slightly beyond a p-n junction defined between the first and second layers, so as to be in ohmic contact with the second layer.

11 Claims, 10 Drawing Figures

//  4,210,924

SEMICONDUCTOR CONTROLLED RECTIFIER WITH CONFIGURED CATHODE TO ELIMINATE HOT-SPOTS

FIELD OF THE INVENTION

The present invention relates to a semiconductor controlled rectifier and more particularly pertains to a structure of a semiconductor controlled rectifier in which initial firing due to a gate trigger current can be established uniformly along a relatively wide region of the p-n junction between two semiconductor layers connected to the gate and cathode electrodes.

BACKGROUND OF THE INVENTION

As is well known, a typical semiconductor controlled rectifier comprises a semiconductor substrate having first, second, third and fourth layers of alternate n- and p-types of conductivities. One main surface of the semiconductor substrate is formed of the exposed surfaces of the first and the second layers and the other main surface is formed of the exposed surface of the fourth layer. A cathode electrode is disposed in ohmic contact with the first layer on one main surface and a gate electrode is disposed in ohmic contact with the second layer on the same surface as mentioned above. On the other hand, an anode electrode is formed in ohmic contact with the fourth layer on the other main surface. An example of a semiconductor controlled rectifier device that employs amplifying gate structure may be found in the U.S. Pat. No. to Kimura et al. 4,063,270.

If a voltage in the forward direction is applied across the anode and the cathode of such a semiconductor controlled rectifier and, further, if a pulse-like gate signal is applied across the gate and cathode, electric current flows between the anode and the cathode rendering the semiconductor controlled rectifier conductive. The conversion of the semiconductor controlled rectifier from the cut-off state to the conductive state is referred to as "turn on".

If the initial firing, which causes the semiconductor controlled rectifier to be turned on, takes place in a narrow region, a heavy firing current flows through the firing region resulting in an increase in temperature and producing a so-called hot spot. Such a phenomenon develops conspicuously particularly when the rate of current increase di/dt (where i denotes a current flowing between the anode and the cathode) flowing into the semiconductor controlled rectifier device is high. The reason is because when di/dt is great, large switching power is dissipated causing the temperature of the narrow firing region to be increased. The development of the hot spot presents the probability of damage to the semiconductor controlled rectifier device, thereby greatly decreasing the reliability of the device.

SUMMARY OF THE INVENTION

The principal object of the present invention is to provide a semiconductor controlled rectifier which is so constructed that the initial firing when the rectifier is turned on is uniformly established over a relatively wide region.

In more detail, the object of the present invention is to provide a semiconductor controlled rectifier having increased reliability by permitting the initial firing to take place uniformly over a relatively wide region so that a hot spot will not be developed when di/dt is great, i.e., even when a large amount of switching power is consumed.

One of the features of the present invention for attaining the abovesaid object consists of disposing a cathode electrode a predetermined distance from both sides of a gate electrode having relatively long sides and relatively short sides in a manner such that the cathode electrode faces the gate electrode, and such that the firing is established in a p-n junction region immediately beneath the cathode electrode facing to the long side of the gate electrode.

Another feature in the present invention consists of disposing a cathode electrode a predetermined distance from both sides of a gate electrode having relatively long sides and relatively short sides in such a manner that the cathode electrode faces the gate electrode, and extending the cathode electrode facing the short sides of the gate electrode slightly beyond the end of junction between a first semiconductor layer and a second semiconductor layer, such that the cathode electrode comes into ohmic contact with the second semiconductor layer.

A further feature of the present invention is that the distance between the gate electrode and a p-n junction defined between the first and second layers, which is formed along the long side of the rectangular electrode separated therefrom, is shorter than the distance between the gate electrode and the p-n junction formed along the short sides of the gate electrode.

Other objects and features of the invention will become more apparent from the following detailed description in conjunction with the accompanying drawings.

BRIEF DESCRIPTION OF THE DRAWINGS

FIG. 1b is a cross-sectional view taken along the line I—I of FIG. 1a;

FIG. 2 is a diagram of potential distribution along the line $X_1$–$X_8$ of FIG. 1a;

FIG. 4b is a cross-sectional view along the line IV—IV of FIG. 4a;

DETAILED DESCRIPTION OF THE PREFERRED EMBODIMENTS

Figure 3:
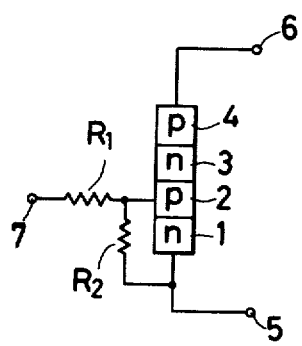
FIG. 3 is a diagram of an equivalent circuit for illustrating the turn-on mechanism of the semiconductor controlled rectifier of FIGS. 1a and 1b.

For the purpose of better understanding of the present invention, the structure of a representative semiconductor controlled rectifier and the mechanism of firing will be described below with reference to FIGS. 1a, 1b and 3.

Figure 1A:
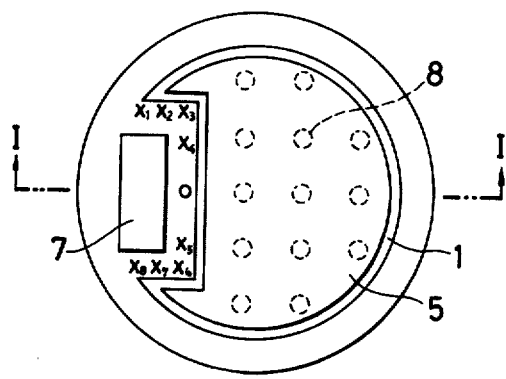
FIG. 1a is a plan view showing a representative semiconductor controlled rectifier.
Figure 1B:
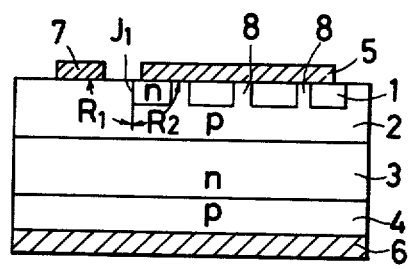

Referring to FIGS. 1a and 1b, reference numerals 1 to 4 represent first, second, third and fourth semiconductor layers, respectively, the p-type semiconductor layers and the n-type semiconductor layers being alternatingly laminated on a semiconductor substrate. Although the drawings show the semiconductor composed of four layers, it is permissible to employ more than four layers. The first semiconductor layer 1 is formed by masking part of the p-type second semiconductor layer 2, and diffusing n-type impurities into other portions. In these drawings, for the purpose of illustration, the first semiconductor layer is formed in a partially cut-away circular form. On the exposed surface of the first semiconductor layer there is formed a cathode electrode 5 in ohmic contact therewith, and on the exposed surface of the second semiconductor layer there is formed a rectangular gate electrode 7 in ohmic contact therewith. In this specification, the rectangular shape is so defined as to include a perfectly rectangular shape, as well as slender arcuate shapes, oval shapes, and other slightly modified shapes. What is important in the present invention is that the shape of the gate electrode consists of relatively long sides and relatively short sides. Usually, the gate electrode is surrounded by the cathode electrode in such a manner that the two short sides and one long side of the rectangular gate electrode are spaced apart by a predetermined distance from the cathode electrode, so that the exposed surfaces of the first and the second semiconductor layers may be utilized as effectively as possible. A portion $J_1$ of the p-n junction between the first semiconductor layer and the second semiconductor layer facing the gate electrode 7 is slightly extended toward the gate electrode as compared to the cathode electrode 5. A number of holes 8 which are usually referred to as short-circuiting holes are formed in the first semiconductor layer in order to improve the characteristic dv/dt (the rate of rise in the forward voltage across the anode and the cathode). The second semiconductor layer and the cathode electrode 5 are in ohmic contact to each other through the short-circuiting holes 8. On the exposed surface of the fourth semiconductor layer 4 there is formed an anode electrode 6 in ohmic contact therewith.

Figure 2:
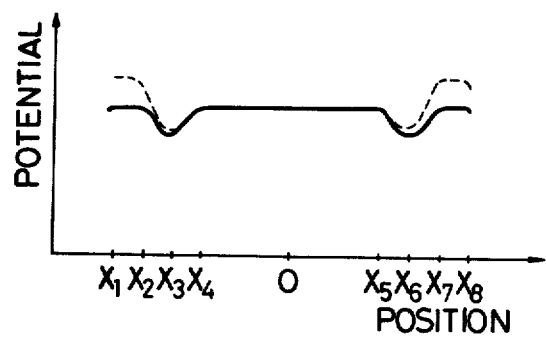

The turn-on mechanism of the semiconductor controlled rectifier having the abovementioned construction will be described below with reference to the equivalent circuit of FIG. 3. In FIG. 3, the same portions as those of FIGS. 1a and 1b are represented by the same reference numerals. The resistance of the current path from the gate electrode 7 to the p-n junction $J_1$ via the second semiconductor layer is denoted by $R_1$, and the resistance of the current path from said p-n junction $J_1$ to the cathode electrode 5 via a short-circuiting hole closest to said junction $J_1$ is denoted by $R_2$. If a voltage is applied to the gate while a voltage in the forward direction is being applied across the cathode electrode 5 and the anode electrode 6, a small current flows from the gate electrode 7 toward the cathode electrode 5 through resistors $R_1$ and $R_2$. If a voltage drop produced by the above small current through the resistor $R_2$ exceeds the build-in voltage level of the p-n junction $J_1$, the gate current is permitted to flow through the p-n junction $J_1$ into the cathode electrode so that the semiconductor controlled rectifier is rendered turned on. Therefore, when the semiconductor controlled rectifier is turned on, on which portion of the p-n junction $J_1$ the firing will take place is determined by the potential distribution of the p-n junction produced by the current flowing between the gate electrode 7 and the cathode electrode 8. This potential distribution is proportional to the resistance ratio $R_2/(R_1+R_2)$. The graph of FIG. 2 is obtained by measuring the potential distribution at the positions $X_1$ to $X_8$ along the p-n junction $J_1$ formed adjacent to the three sides of the gate electrode 7. The solid line shows the dispersion of resistance of the second semiconductor layer 2, and the potential distribution when there is no deviation in position of the patterns of the electrodes 7 and 5. In this case, the junction portions are spaced apart by an equal distance from the gate electrode 7 in the regions $X_1$-$X_2$, $X_4$-$X_5$, and $X_7$-$X_8$, and the potential is nearly constant. In the regions $X_2$-$X_4$ and $X_5$-$X_7$, however, the junction portions are separated more apart from the gate electrode, whereby the resistance $R_1$ is increased and the potential is decreased. If the resistance of the second semiconductor layer is not uniform, or if the positions of the electrodes 7 and 5 are deviated from each other, the potential at the junction of the regions $X_1$-$X_2$ and $X_7$-$X_8$ may often become greater than the potential at other regions of the junction. In the regions having a potential higher than that of the other regions, the carriers are concentrated in large amounts from the first semiconductor layer 1 to the second semiconductor layer 2, so that the regions of the initial firing are limited to these narrow regions $X_1$-$X_2$ and $X_7$-$X_8$. Even when the junction has a potential distribution as represented by the solid line, the firing which took place at some regions such as $X_1$-$X_2$ or $X_7$-$X_8$ is not often allowed to instantaneously and uniformly spread to the region $X_4$-$X_5$ interrupted by a low potential at the positions $X_3$ and $X_6$.

If the region of the initial firing is limited to narrow regions as mentioned above, a heavy current flows in a concentrated manner through the narrow regions thereby developing hot spots. If di/dt (i represents a current flowing between the anode and the cathode) of the semiconductor controlled rectifier element increases, dv/dt (v denotes a voltage across the anode and the cathode) decreases. However, since the gradient of di/dt is usually more steep than that of dv/dt, an increased amount of electric power is consumed by the element particularly when di/dt is great, whereby the temperature is greatly raised giving rise to the development of hot spots. The hot spots often result in damage to of the element, greatly decreasing the reliability, as mentioned above.

As will be obvious from the foregoing, the firing regions are restricted to narrow regions due to the fact that the junction $J_1$ includes the regions $X_1$-$X_2$ and $X_7$-$X_8$ having high potentials, and regions $X_2$-$X_4$ and $X_5$-$X_7$ having low potentials. To solve this problem, the initial firing should be forcibly established in the region $X_4$-$X_5$. The region $X_4$-$X_5$ corresponds to the long side of the gate electrode 7, and exhibits a nearly uniform potential distribution over a relatively wide region. Therefore, if the firing takes place at any point in the region $X_4$-$X_5$, the firing region instantaneously spreads throughout the whole region $X_4$-$X_5$, preventing the development of hot spots.

Figure 4A:
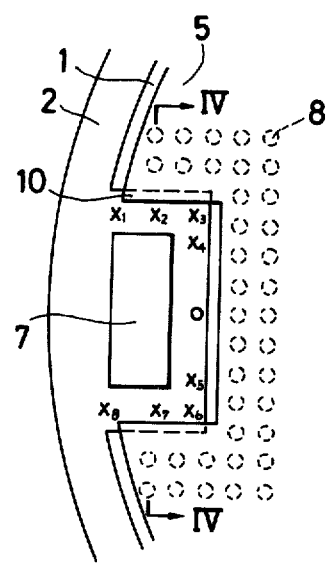
FIG. 4a is a plan view showing part of the semiconductor controlled rectifier according to an embodiment of the present invention.
Figure 4B:
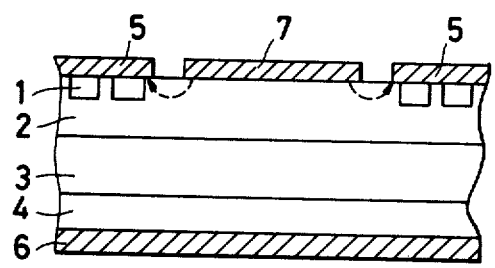

The present invention is constructed based on the abovementioned consideration. An embodiment of the invention is shown in FIG. 4a and FIG. 4b. FIG. 4a is a plan view showing a portion of the semiconductor controlled rectifier, and FIG. 4b is a cross-sectional view along the section IV—IV of FIG. 4a, in which the same portions as those of FIGS. 1a and 1b are represented by the same reference numerals.

As will be understood from the drawings, according to this embodiment, portions of the cathode electrode 5 facing the short sides of the gate electrode 7 are defined by the side ends of the first semiconductor layer and the second semiconductor layer. The above-mentioned portions of the cathode electrode are extended toward the gate electrode beyond the p-n junction to come into ohmic contact with the second semiconductor layer 2. The portions of the cathode electrode that are in ohmic contact with the second semiconductor layer 2 are hereinafter referred to as short-circuiting portions. The portion of the cathode electrode facing the long side of the gate electrode 7, on the other hand, merely extends up to the inner side of the p-n junction between the side end of the first semiconductor layer and the second semiconductor layer. As a result, when the initial firing has taken place, the electric current flows through a path including resistances $R_1$ and $R_2$ of FIG. 1b over the region in which the cathode electrode 5 faces to the long side of the gate electrode 7. In the regions in which the cathode electrode 5 faces the short sides of the gate electrode 7, the electric current flows through paths indicated by dotted lines of FIG. 4b. That is, the short-circuiting portions 10 electrically short-circuit the gate electrode 7 to some portions of the cathode electrode, such that the potential is maintained at zero in the p-n junction between the first semiconductor layer and the second semiconductor layer.

Figure 5:
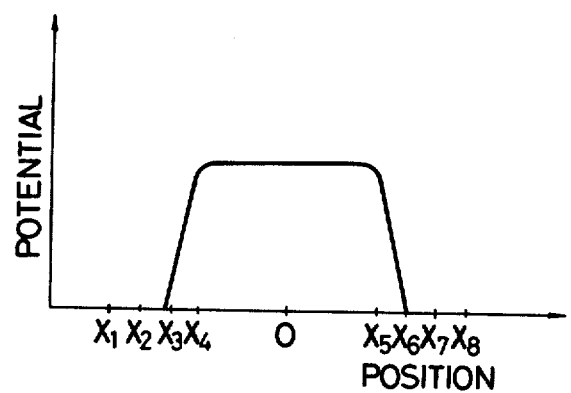
FIG. 5 is a diagram of potential distribution in the semiconductor controlled rectifier of FIGS. 4a and 4b.

FIG. 5 shows the potential distribution at the points $X_1$-O-$X_8$ on the junction portions between the side ends of the first semiconductor layer and the second semiconductor layer when a gate current is caused to flow in the forward direction from the gate electrode 7 toward the cathode electrode 5. In the regions $X_1$-$X_3$ and $X_6$-$X_8$, the potential becomes nearly zero, while a uniform potential is produced over the region $X_4$-O-$X_5$. In the regions $X_4$-$X_3$ and $X_5$-$X_6$ remote from the gate electrode 7, the resistance $R_1$ increases and the potential decreases drastically.

Therefore, the initial firing established by the gate trigger takes place over the region $X_4$-O-$X_5$ facing the long side of the gate electrode 7; i.e., the initial firing is uniformly established over a relatively wide region.

What is important in the abovementioned embodiment is that the short-circuiting portions 10 are formed along the entirety of regions $X_1$-$X_3$ and $X_6$-$X_8$ facing the short sides of the gate electrode 7. When the short-circuiting portions are formed only at limited portions of the cathode electrode, for example, at the positions $X_1$ and $X_8$ only, the firing may take place at p-n junction portions facing the gate electrodes, presenting the probability of developing hot spots. Two advantages can be provided by the provision of short-circuiting portions 10. One advantage is that the initial firing is uniformly established over a relatively wide region as mentioned above, making it possible to prevent the development of hot spots; the element is not destroyed even when di/dt becomes great.

Another advantage is the prevention of the semiconductor controlled rectifier from being misfired by noise. The reason is attributed to the fact that the electric current flowing from the gate electrode 7 toward the short-circuiting portions 10 turns into a wasteful current that does not contribute to the initial firing of the semiconductor controlled rectifier, whereby the sensitivity of the firing is decreased by a corresponding amount. The semiconductor controlled rectifier having excessively high sensitivity for gate trigger current tends to be misfired even by small noise.

Figure 6:
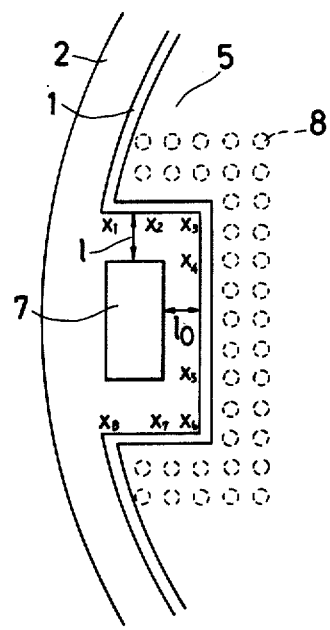
FIG. 6 and FIG. 7 are plan views of the semiconductor controlled rectifiers according to other embodiments of the present invention.

FIG. 6 is a plan view showing a portion of the semiconductor controlled rectifier according to another embodiment of the present invention. A cross-sectional view thereof is not pesented here, since it can be easily understood from FIG. 1b.

Figure 8:
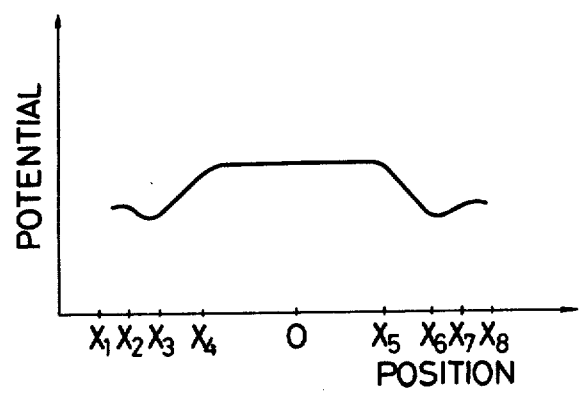
FIG. 8 is a diagram of potential distribution of the semiconductor controlled rectifier of FIG. 6.

The feature of the semiconductor controlled rectifier according to this embodiment is that the gate electrode 7 is so disposed that the distance l between the p-n junction (junction defined by the side end of the first semiconductor layer and the second semiconductor layer) facing the short sides of the rectangular electrode 7 and the gate electrode 7 is greater than the distance $l_0$ between the p-n junction facing the long side of the rectangular gate electrode 7 and the gate electrode 7. By this arrangement, the resistance of the second semiconductor layer between the gate electrode 7 and the regions $X_1$-$X_2$ and $X_7$-$X_8$ becomes greater than the resistance between the gate electrode 7 and the region $X_4$-$X_5$. Therefore, the potential developed along $X_1$-$X_8$ by the gate trigger current is as shown in FIG. 8; the potential is nearly constant over the region $X_4$-$X_5$, and the potential becomes small over the regions $X_1$-$X_2$ and $X_7$-$X_8$. Accordingly, the initial firing is established over the region $X_4$-$X_5$, providing the same effect as that of the embodiment shown in FIGS. 4a and 4b.

Further, the short-circuiting portions 10 may be provided as shown in FIG. 4a, and the gate electrode may be so disposed as to satisfy the relation $l > l_0$ as shown in FIG. 6. In this case, the initial firing can be established not only over the relatively broad region $X_4$-$X_5$, but also it is allowed to adjust the intensity of the loss current flowing from the gate 7 toward the short-circuiting portions 10, making it possible to adjust the sensitivity of firing.

Referring to FIGS. 4a, 4b and 6, it can be easily understood that the short-circuiting holes 8 are not an essential requirement for the present invention and may be eliminated.

Figure 7:
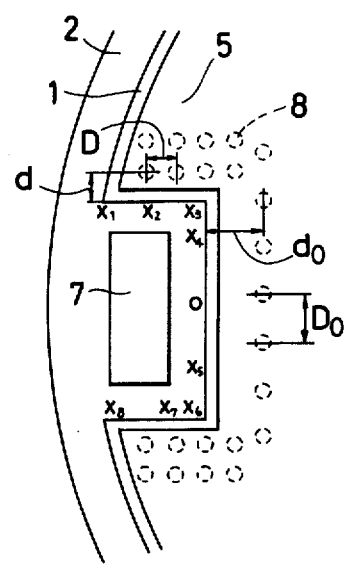

FIG. 7 shows a further embodiment according to the present invention. In this embodiment, the short-circuiting holes are so disposed that the distance d from the p-n junction facing the short sides of the gate electrode 7 to a neighboring short-circuiting hole 8 is smaller than the distance $d_0$ from the p-n junction facing the long side of the gate electrode 7 to a neighboring short-circuiting hole 8. Moreoever, the short-circuiting holes have been so arranged that the distance D among the neighboring short-circuiting holes near the p-n junction facing the short sides of the gate electrode 7 is shorter than the distance $D_0$ among the neighboring short-circuiting holes located near the p-n junction facing the long side of the gate electrode 7. When either one of the abovementioned requirements $d < d_0$ and $D < D_0$ is satisfied, the resistance from the p-n junction over the $X_1$-$X_2$ and $X_7$-$X_8$ regions toward the cathode electrode through the second semiconductor layer and short-circuiting holes becomes smaller than the resistance from the p-n junction over the region $X_4$-O-$X_5$ toward the cathode electrode. After all, the potential distribution along $X_1$-$X_8$ becomes nearly equal to that of FIG. 8. It will therefore be apparent that the effect similar to that of the aforementioned embodiment is obtained.

Although some embodiments of the present invention in the foregoing, it should be noted that the present invention is not necessarily restricted to those of the aforementioned embodiments only but can be variously modified without departing from the spirit and scope of the present invention. That is, the essential feature of the present invention is that the potential distribution produced on the p-n junction between the side ends of the first semiconductor layer and the second semiconductor layer by the gate trigger current, is so controlled that the potential on the p-n junction facing the short sides of the gate electrode is smaller than the potential on the p-n junction facing the long side of the gate electrode. The abovesaid potential distribution can also be achieved by selectively diffusing impurities into the second semiconductor layer around the gate electrode to partially vary the resistance of the layer, or by forming grooves in the second semiconductor layer by means of etching to vary the electrical resistance.

Further, according to the present invention, the kinds and types of the semiconductor controlled rectifiers are not critical; the present invention can also be applied to the semiconductor controlled rectifiers of the amplifier type having an auxiliary gate and a main gate.

Moreover, as mentioned already, the shape of the gate electrode needs not be limited to a rectangular shape, and the invention can be extensively applied to ordinary semiconductor controlled rectifiers having long sides and short sides in which the cathode electrode is formed adjacent to both of such sides.

What is claimed is:

1. A semiconductor controlled rectifier comprising:
   (a) a semiconductor substrate having first, second, third and fourth layers of alternatively different conductivity types and having a pair of main surfaces on the opposite sides of said substrate, one of said main surfaces being formed of the exposed surfaces of at least said first and second layers and the other main surface being formed of the exposed surface of at least said fourth layer;
   (b) a gate electrode provided in ohmic contact with said second layer on said one main surface and being of a shape having a relatively long side and a relatively short side;
   (c) a cathode electrode provided in ohmic contact with said first layer on said one main surface and disposed adjacent to and spaced apart from said gate electrode, said cathode electrode having a first portion extending along the short side of said gate electrode and a second portion extending along the long side of said gate electrode, said first portion of said cathode electrode being formed to extend toward said gate electrode a p-n junction defined between said first layer extending along said first portion of the cathode electrode and said second layer so as to be in ohmic contact with said second layer to short circuit the gate electrode to the cathode electrode along the short side of the gate electrode when firing of the semiconductor control rectifier occurs so that said firing will take place between the long side of the gate electrode and the second portion of the cathode electrode; and
   (d) an anode electrode provided in ohmic contact with said fourth layer on said other main surface.

2. A semiconductor controlled rectifier comprising:
   (a) a semiconductor substrate having first, second, third and fourth layers of alternate p- and n-type conductivities and having a pair of main surfaces on the opposite sides of said substrate, one of said main surfaces being formed of the exposed surfaces of at least said first and second layers and the other main surface being formed of the exposed surface of at least said fourth layer;
   (b) a gate electrode provided in ohmic contact with said second layer on said one main surface and being of a shape having a relatively long side and a relatively short side;
   (c) a cathode electrode provided in ohmic contact with said first layer on said one main surface and disposed adjacent to and spaced apart from said gate electrode; said cathode electrode having a first portion extending along the short side of said gate electrode and a second portion extending along the long side of said gate electrode, said gate electrode being such disposed that the distance between said short side of said gate electrode and a p-n junction defined by said first layer beneath said first portion of the cathode electrode and said second layer is greater than the distance between said long side of said gate electrode and a p-n junction defined by said first layer beneath said second portion of the cathode electrode and said second layer; and
   (d) an anode electrode provided in ohmic contact with said fourth layer on said other main surface.

3. A semiconductor controlled rectifier as claimed in claim 2, wherein said first layer is provided with a plurality of short-circuiting holes through which said cathode electrode is in ohmic contact with said second layer.

4. A semiconductor controlled rectifier comprising:
   (a) a semiconductor substrate having first, second, third and fourth layers of alternate n- and p-conductivities and having a pair of main surfaces one of which is formed of the exposed surface of said first and second layers and the other of which is formed of the exposed surface of said fourth layer;
   (b) a gate electrode provided in ohmic contact with said second layer on said one main surface and being of a shape having a relatively long side and a relatively short side;
   (c) a cathode electrode provided in ohmic contact with said first layer on said one main surface and disposed adjacent to and spaced apart from said gate electrode, said cathode electrode having a first portion extending along the short side of said gate electrode and a second portion extending along the long side of said gate electrode, said first layer being provided with a plurality of short circuiting holes through which said cathode electrode is in ohmic contact with the second layer, the holes which are positioned along said first portion of the cathode electrode being arranged closer in distance to a p-n junction defined between sides of the first layer extending along the short and long sides of said gate electrode and the second layer than the holes which are positioned along said second portion of said cathode electrode; and
   (d) an anode electrode provided in ohmic contact with said fourth layer on said other main surface.

5. A semiconductor controlled rectifier comprising:
   (a) a semiconductor substrate having first, second, third, and fourth layers of alternate n- and p-conductivity types and having a pair of main surfaces one of which is formed of the exposed surface of said first and second layers and the other of which is formed of the exposed surface of said fourth layer;
   (b) a gate electrode provided in ohmic contact with said second layer on said one main surface and being of a shape having a relatively long side and a relatively short side;
   (c) a cathode electrode provided in ohmic contact with said first layer on said one main surface and disposed adjacent to and spaced apart from said gate electrode, said cathode electrode having a first portion extending along the short side of said gate electrode and a second portion extending along the long side of said gate electrode, said first layer being provided with a plurality of short-circuiting holes through which said cathode electrode is in ohmic contact with the second layer, the distance between holes which are positioned along said first portion of said cathode electrode being smaller than the distance between holes which are positioned along said second portion of said cathode electrode; and (d) an anode electrode provided in ohmic contact with said fourth layer on said other main surface.

6. A semiconductor controlled rectifier comprising:
(a) a semiconductor substrate having a pair of main surfaces on the opposite sides of said substrate and a four layer structure between said main surfaces consisting of at least a first, a second, a third and a fourth layers of alternate n- and p-type conductivities, one of said main surfaces being formed of the exposed surfaces of at least said first and second layers and the other main surface being formed of the exposed surface of at least said fourth layer;
(b) a gate electrode formed on said second layer on said one main surface and having a shape including a relatively long side and a relatively short side;
(c) a first main electrode kept in low resistance contact with said first layer on said one main surface and disposed adjacent to and spaced apart from said gate electrode, said first main electrode having a first portion extending along the short side of said gate electrode and a second portion extending along the long side of said gate electrode;
(d) means for providing a resistance between said gate electrode and a p-n junction defined by the second layer and the first layer disposed beneath said first portion of said first main electrode, said resistance being selected larger in value than a resistance between said gate electrode and a p-n junction defined by the second layer and the first layer disposed beneath said second portion of said first main electrode; and
(e) a second main electrode kept in low resistance contact with said fourth layer on said other main surface.

7. A semiconductor controlled rectifier comprising:
(a) a semiconductor substrate having a pair of main surfaces and a four layer structure between said main surfaces consisting of at least a first, a second, a third and a fourth layers of alternate n- and p-type conductivities, one of said main surfaces being formed of the exposed surfaces of said first and second layers and the other main surface being formed of the exposed surface of at least said fourth layer;
(b) a gate electrode formed on said second layer on said one main surface and having a shape including a relatively long side and a relatively short side;
(c) a first main electrode kept in low resistance contact with said first layer on said one main surface and disposed adjacent to and spaced apart from the gate electrode, said first main electrode having a first portion extending along the short side of said gate electrode and a second portion extending along the long side of said gate electrode;
(d) means for providing a resistance between said first main electrode and a p-n junction defined by the second layer and the first layer disposed beneath said first portion of said first main electrode, said resistance being selected smaller in value than a resistance between said first main electrode and a p-n junction defined by the second layer and the first layer disposed beneath said second portion of said first main electrode; and
(e) a second main electrode kept in low resistance contact with said fourth layer on said other main surface.

8. A semiconductor controlled rectifier comprising:
(a) a semiconductor substrate having a pair of main surfaces on the opposite sides of said substrate and a four layer structure between said main surfaces consisting of at least a first, a second, a third, and a fourth layer of alternate n- and p-type conductivities, one of said main surfaces being formed on the exposed surfaces of at least said first and second layers and the other main surface being formed of the exposed surface of at least said fourth layer;
(b) a gate electrode formed on said second layer on said one main surface and having a shape including a relatively long side and a relatively short side;
(c) a first main electrode kept in low resistance contact with said first layer on said one main surface and disposed adjacent to and spaced apart from said gate electrode, said first main electrode having a first portion extending along the short side of said gate electrode and a second portion extending along the long side of said gate electrode;
(d) means for causing the distribution of an electrical potential due to a gate trigger current along a p-n junction defined between said first and second layers such that the potential along a p-n junction part beneath said first portion of said first main electrode is smaller than a potential along a p-n junction part beneath said second portion of said first main electrode; and
(e) a second main electrode kept in low resistance contact with said fourth layer on said other main surface.

9. A semiconductor controlled rectifier according to claim 1, wherein said first layer is provided with a plurality of short-circuiting holes through which said cathode electrode is in ohmic contact with said second layer.

10. A semiconductor controlled rectifier as claimed in claim 1, wherein said gate electrode is so disposed that the distance between said long side of said gate electrode and a p-n junction defined between a side of said first layer extending along said long side of the gate electrode and said second layer is less than the distance between said short side of said gate electrode and a p-n junction defined between a side of said first layer extending along said short side of the gate electrode and said second layer.

11. A semiconductor controlled rectifier according to claim 10, wherein said first layer is provided with a plurality of short-circuiting holes through which said cathode electrode is in ohmic contact with said second layer.

* * * * *